(12) United States Patent
Holz (10) Patent No.: US 7,545,016 B2
(45) Date of Patent: Jun. 9, 2009

(54) INTEGRATED LAYER STACK ARRANGEMENT, OPTICAL SENSOR AND METHOD FOR PRODUCING AN INTEGRATED LAYER STACK ARRANGEMENT

(75) Inventor: Jürgen Holz, Dresden (DE)

(73) Assignee: Infineon Technologies AG, Munich (DE)

( * ) Notice: Subject to any disclaimer, the term of this patent is extended or adjusted under 35 U.S.C. 154(b) by 288 days.

(21) Appl. No.: 11/391,613

(22) Filed: Mar. 28, 2006

(65) Prior Publication Data

US 2006/0261430 A1    Nov. 23, 2006

Related U.S. Application Data

(63) Continuation of application No. PCT/DE2004/002165, filed on Sep. 29, 2004.

(30) Foreign Application Priority Data

Sep. 30, 2003    (DE) ................ 103 45 453

(51) Int. Cl.
   *H01L 31/058*    (2006.01)
   *H01L 31/062*    (2006.01)
   *H01L 31/113*    (2006.01)

(52) U.S. Cl. .............. 257/461; 257/294; 257/E21.58

(58) Field of Classification Search .......... 257/461, 257/431, 432, 440, 292, 294, E21.58, E21.582, 257/E31.057
   See application file for complete search history.

(56) References Cited

U.S. PATENT DOCUMENTS

| | | | |
|---|---|---|---|
| 4,606,115 A | | 8/1986 | Kervin et al. ........... 29/572 |
| 5,091,018 A | * | 2/1992 | Fraas et al. ............ 257/189 |
| 6,255,217 B1 | * | 7/2001 | Agnello et al. ......... 438/687 |
| 6,846,899 B2 | * | 1/2005 | Lim et al. ............ 528/86 |
| 7,067,895 B1 | * | 6/2006 | Razouk ............... 257/461 |
| 7,179,879 B2 | * | 2/2007 | Lim et al. ............ 528/86 |
| 7,193,289 B2 | * | 3/2007 | Adkisson et al. ....... 257/431 |

(Continued)

FOREIGN PATENT DOCUMENTS

DE    199 63 864 A1    8/2000

(Continued)

OTHER PUBLICATIONS

International Search Report for corresponding International Patent Application No. PCT/DE2004/002165, dated Mar. 18, 2005.

*Primary Examiner*—Walter L Lindsay, Jr.
(74) *Attorney, Agent, or Firm*—Brinks Hofer Gilson & Lione (57) ABSTRACT

An integrated layer stack arrangement, an optical sensor and a method for producing an integrated layer stack arrangement is disclosed. Generally, an integrated layer stack arrangement includes a plurality of layer stacks arranged on top of each other, each layer stack including a metal layer and a dielectric layer arranged; at least one photodiode integrated into the plurality of layer stacks; a trench arranged above the last least one photodiode, the trench extending through at least a portion of the plurality of layer stacks so that light impinging on the plurality of layer stacks impinges on the integrated photodiode along the trench; a first passivation partial layer applied on the plurality of layer stacks; and a second passivation partial layer applied on the plurality of layer stacks and a bottom and walls of the trench.

16 Claims, 9 Drawing Sheets

U.S. PATENT DOCUMENTS

| | | | |
|---|---|---|---|
| 2006/0261430 A1* | 11/2006 | Holz | 257/461 |
| 2008/0150052 A1* | 6/2008 | Lee | 257/432 |
| 2008/0150057 A1* | 6/2008 | Lee et al. | 257/432 |
| 2008/0191296 A1* | 8/2008 | Wang et al. | 257/432 |

FOREIGN PATENT DOCUMENTS

| | | |
|---|---|---|
| DE | 100 22 660 A1 | 11/2001 |
| EP | 0 757 380 A2 | 2/1997 |
| EP | 0 987 767 A2 | 3/2000 |
| WO | WO 01/08213 A1 | 2/2001 |

* cited by examiner

INTEGRATED LAYER STACK ARRANGEMENT, OPTICAL SENSOR AND METHOD FOR PRODUCING AN INTEGRATED LAYER STACK ARRANGEMENT

RELATED APPLICATIONS

The present patent document is a continuation of Patent Cooperation Treaty Application No. PCT/DE2004/002165, filed Sep. 29, 2004, which claims priority to German Application No. DE 2003 010345453.5, filed Sep. 30, 2003, the entirety of which are both hereby incorporated by reference.

BACKGROUND

The present disclosure relates to an integrated layer stack arrangement, an optical sensor and also a method for producing an integrated layer stack arrangement.

In a conventional CMOS camera (Complementary Metal Oxide Semiconductor camera), a plurality of layer stacks having alternately in each case a patterned metal layer, usually made of aluminum in accordance with the prior art, and an intermetal dielectric layer, usually made of silicon dioxide, are applied above a photodiode integrated in a substrate. Light to be detected which is radiated in onto the known CMOS camera passes through the plurality of layer stacks and finally impinges on the photodiode. In the photodiode, the optical energy is converted into electrical energy and the electrical energy is if appropriate amplified, digitized and processed further by means of an evaluation circuit.

In future CMOS technologies, the material used for the metal layers, i.e. the metallization planes, will no longer be aluminum but rather is expected to be copper. With the use of copper for wiring in the respective metallization planes, diffusion barriers are required in order to prevent copper atoms from diffusing into the intermetal dielectric, preferably silicon dioxide ($SiO_2$). An alternative material for the intermetal dielectric is an electrically insulating low-k material, for example SiLK™. Silicon nitride ($Si_3N_4$) is usually used as material for the diffusion barriers.

In future products, the layer thickness of a diffusion barrier layer will be approximately 50 nm and less and the thickness of an intermetal dielectric layer will be approximately 400 nm to 1000 nm.

Silicon is usually used as a substrate. If a photodiode is integrated in the silicon substrate in the product, from the surface of the component a light that is incident there has to penetrate through all the layer stacks applied above the photodiode until it can penetrate into the photodiode and can lead to the generation of electrical charge carriers there.

Owing to the different optical density of the material of the intermetal dielectric (silicon dioxide/low-k material usually have a refractive index n of approximately 1.5) and of the diffusion barrier (silicon nitride has a refractive index n of approximately 2) multiple interferences occur in the optical path of the light beams passing through the layer stacks.

Figure 2:
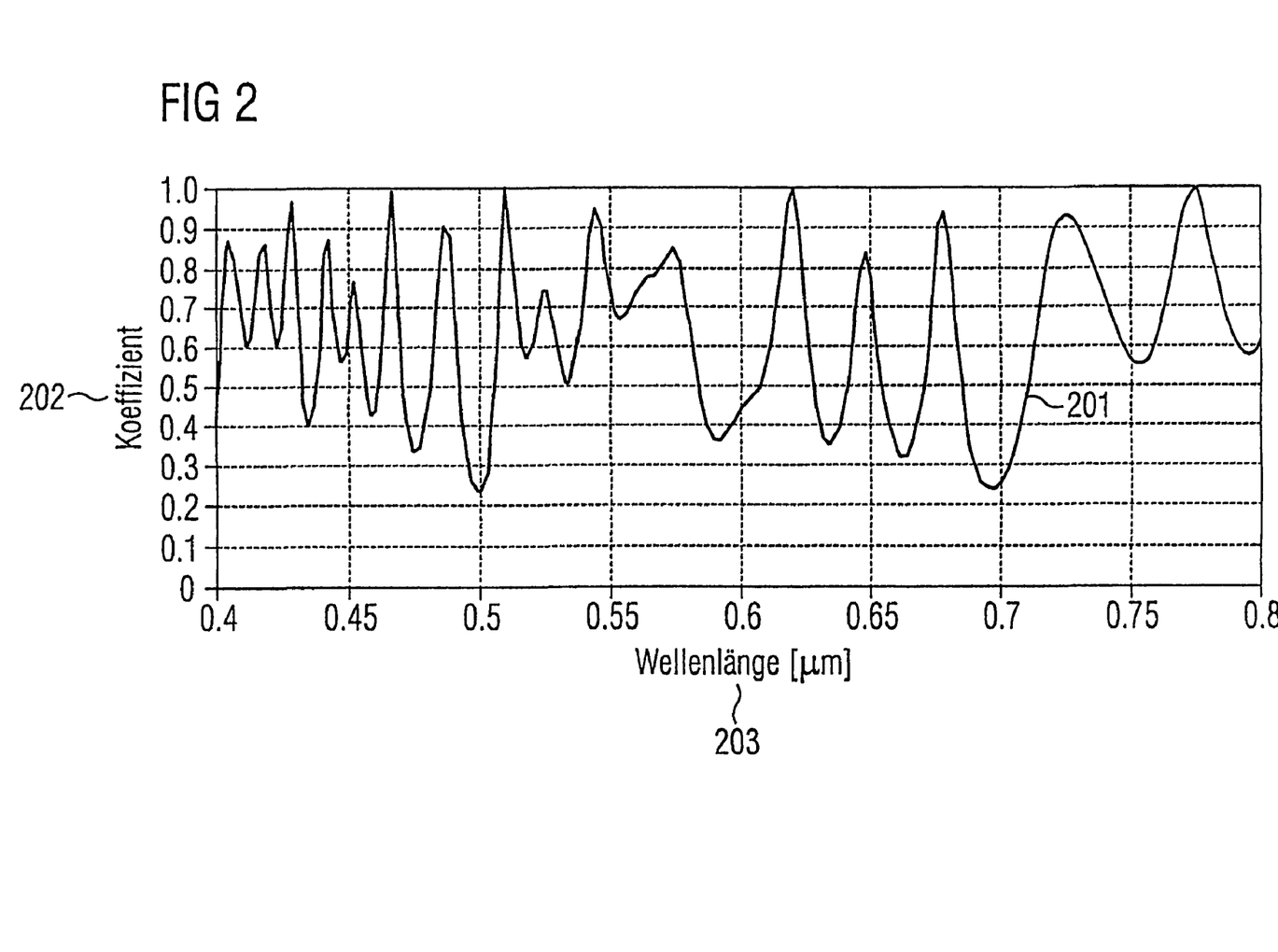
FIG. 2 shows a transmission curve of a layer stack arrangement in accordance with the prior art.

FIG. 2 shows an ascertained transmission curve 201, illustrating the transmission coefficient 202 depending on the wavelength 203 of the light that is respectively radiated in for an above-described layer stack arrangement in accordance with the prior art with copper as metal for the conductor tracks and silicon nitride as diffusion barrier material.

As can be gathered from the transmission curve 201 in FIG. 2, on account of the, to an approximation, chaotic and thus unpredictable distributions of the transmission curve maxima, it is not possible to suitably dimension the layer stack arrangement such that a maximum quantity of light impinges on the photo-diode, i.e. that only a minimum quantity of light is reflected by the layer stacks.

As can furthermore be gathered from the transmission curve 201, a plurality of layer stacks in the layer stack arrangement of a CMOS camera in the case where copper metallization is used reduces the mean optical transmission to 65% for individual wavelengths even down to 20%.

For a CMOS camera or for an optical mouse into which is introduced an electronic chip with above-described technology with photodiodes, this leads to an increased current consumption and to a reduction of the yield.

One solution to the problem described above might consist in optimizing the thicknesses of the layers of the intermetal dielectric and of the diffusion barriers and in monitoring the thicknesses of the layers very precisely and thus optimizing the transmission for a specific wavelength. However, this leads to a considerably increased outlay in the production of such an integrated layer stack arrangement.

One alternative would be, furthermore, to replace the material of the diffusion barrier, i.e. currently silicon nitride, with a material that has the same or a very similar optical density as or to the material of the intermetal dielectric used, copper. However, this would require a redevelopment and qualification of the entire back-end process.

Furthermore, one possibility for solving the problem described above would be to irradiate the integrated layer stack arrangement in accordance with the prior art with light having increased intensity in order thus to compensate for the only low transmission. However, this procedure considerably increases the current consumption, thereby decreasing for example the battery endurance time of radio mouses, for example. Generally, an increased current consumption in the case of a device with such an integrated layer stack arrangement is not desired.

BRIEF SUMMARY

The present disclosure describes a photodetector arrangement and a method for producing a photodetector arrangement, a trench being etched through a plurality of metallization planes. A photodiode is arranged below the trench. A layer made of silicon dioxide is applied over the whole area on the upper surface of the intermetal dielectric and also on the trench bottom and the trench walls. An additional layer made of silicon nitride is applied on the layer made of silicon dioxide. Furthermore, the present disclosure describes a method for plasma treatment for improving the adhesion of inorganic dielectrics on copper. Furthermore, the present disclosure describes a method for on-chip connection of copper conductor tracks.

The disclosure is based on the problem of improving the transmission properties for a layer stack arrangement described above. The problem is solved by means of the integrated layer stack arrangement, the optical sensor and also the method for producing an integrated layer stack arrangement having the features in accordance with the independent patent claims.

An integrated layer stack arrangement has a plurality of partial layer stacks arranged one above the other, each partial layer stack having a metal layer and a dielectric layer. Furthermore, an integrated photodiode is provided in the integrated layer stack arrangement. A trench is formed in a manner arranged above the photodiode, said trench extending through at least a portion of the partial layer stacks in such a way that light impinging on the layer stack arrangement above the photodiode impinges on the photodiode along the trench. An optical sensor has a multiplicity of integrated layer stack arrangements such as are described above.

In a method for producing an integrated layer stack arrangement, a plurality of layer stacks arranged one above the other are formed, each layer stack having a metal layer and a dielectric layer. At least a portion of the layer stacks is removed above at least one integrated photodiode, so that a trench is formed in such a way that light impinging on the layer stack arrangement impinges on the photodiode along the trench.

Clearly, the disclosure can be seen in the fact that the major interferences of the light passing through the plurality of layer stacks are reduced or are even eliminated by forming, preferably etching, above the photodiode a trench through at least a portion of the layer stacks preferably through all the layer stacks to the last intermetal dielectric, given the existence of a diffusion layer to the bottommost diffusion barrier layer arranged adjacent to the substrate.

In this way, the interferences of the light that impinges on the layer stack arrangement and enters into the latter on its way toward the photodiode are considerably reduced and the optimization of the layer stack arrangement with regard to the maximum transmission of the light that impinges on the layer stack arrangement and passes through the latter is considerably simplified.

What is thus achieved according to the disclosure is that a device with such an integrated layer stack arrangement, for example an optical sensor, preferably a CMOS camera or an optical computer mouse, has a higher light sensitivity and thus manages with lower illumination; the current consumption is thereby considerably reduced. If the respective device is operated with a battery, then the operating duration of the device with the battery is considerably increased according to the disclosure.

The optical sensor according to the disclosure is suitable as a sensor for detecting light, as a sensor in the context of automotive engineering, for example as a sensor for detecting an event that leads to the triggering of an airbag, or else as a speed sensor, generally as an optical sensor for detecting light impinging on the surface of the optical sensor.

Between the metal layer and the dielectric layer a diffusion barrier layer may be provided in at least a portion of the layer stacks, said diffusion barrier layer preventing metal atoms from the metal layer from diffusing into the dielectric layer.

This refinement of the disclosure is advantageous in particular for the case where a copper layer is used as the metal layer, i.e. where the metal layer has copper or comprises copper.

Another refinement of the disclosure provides for the dielectric layer to have silicon dioxide or consist of silicon dioxide.

The diffusion barrier layer may have silicon nitride and/or silicon carbide or consist of silicon nitride and/or silicon carbide.

It should be pointed out in this connection that the disclosure can be used particularly advantageously whenever the optical density of the material of the metal layer and the optical density of the material of the dielectric layer and/or the optical density of the material of a diffusion barrier layer provided and the optical density of the material of the dielectric layer differ considerably from one another, as is the case for example with the materials silicon nitride and silicon dioxide.

In accordance with one refinement of the disclosure, a passivation layer is applied at least above the layer stacks and the trench in order to protect the material of the layer stacks and the photodiode.

The passivation layer preferably has silicon nitride or consists of silicon nitride.

Another refinement of the disclosure provides for an electrical circuit for processing the electrical signal generated by the photodiode to be provided in the integrated layer stack arrangement, the electrical circuit being coupled to an output of the photodiode, so that the electrical signal generated by the photodiode is fed to the electrical circuit.

The electrical circuit may have an amplifier circuit and/or an analog/digital converter circuit, a preprocessing of the analog electrical signal generated by the photodiodes being ensured by means of said circuit(s).

In the case of the optical sensor, one refinement of the disclosure provides for the integrated layer stack arrangement to be introduced in a housing of the optical sensor, the housing having a light-transmissive cover arranged above the trench in such a way that light impinging on the housing, more precisely on the cover, can pass through the light-transmissive cover to the trench.

Preferably, the housing is a ceramic housing and the light-transmissive cover is a glass cover.

An alternative embodiment of the disclosure of the optical sensor provides for the integrated layer stack arrangement to be introduced into an optical potting composition, the optical potting composition preferably having epoxy resin or consisting of epoxy resin.

In this refinement of the disclosure, the optical potting composition is preferably partly or completely likewise filled into the trench. The interferences that furthermore occur in the prior art are avoided, however, on account of the use of the optical potting composition.

In one refinement of the method according to the disclosure, it is provided that a first passivation partial layer is applied prior to the formation of the trench on the layer stacks and the trench is formed preferably by means of an additional suitable mask above the photodiode, preferably by means of etching, particularly preferably by means of anisotropic dry etching, the first passivation partial layer being removed in the region in which the trench is formed. The first passivation partial layer is preserved, however, in the other regions of the layer stack arrangement. After the trench has been formed, a second passivation partial layer is applied on the first passivation partial layer and also on the trench bottom and the trench walls, so that the entire surface of the layer stack arrangement is protected by means of the first passivation partial layer and/or by the second passivation partial layer.

The integrated layer stack arrangement according to the disclosure, which may be integrated in a CMOS chip, may for example also be used for detecting a fingerprint. In this case, the CMOS chip is set up as a fingerprint sensor.

It should be noted that the optical sensor is usually provided with a multiplicity of integrated photodiodes and layer stack arrangements which, analogously to a CMOS camera, are coupled to circuits integrated in the substrate for evaluation of the electrical signals generated by the photodiodes.

Another refinement of the disclosure provides for the integrated layer stack arrangement to be introduced in a housing. In this case, the trench/trenches remains/remain uncovered; to put it another way, the sensor remains open in the photodiode region.

Furthermore, a lens/a plurality of lenses may be provided in the trench/trenches, an optical lens in each case being provided in at least a portion of the trenches, said lens covering at least a portion of the respective trench. To put it another way, the lens forms the housing and the protection for the photodiode in the respective trench.

At the edge, potting composition may for example protect the pads, but the potting composition does not penetrate as far as the sensor array itself.

Above the respective photodiode, in the context of processing, a portion of the metallization structures, for example made of copper, may be contained prior to the removal thereof. Preferably, however, the region above the respective photodiode is free of the metallization structures.

Exemplary embodiments of the disclosure are illustrated in the figures and are explained in more detail below.

DETAILED DESCRIPTION OF THE DRAWINGS

Figure 5:
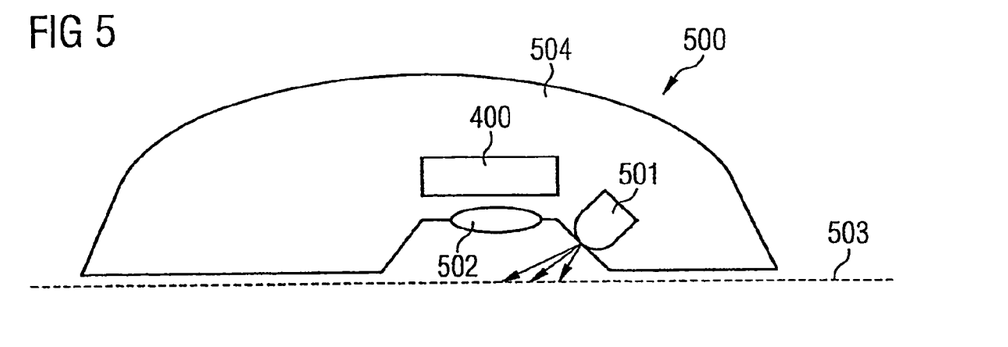
FIG. 5 shows a sketch of one embodiment of a computer mouse.

FIG. 5 shows a computer mouse 500 in accordance with a first exemplary embodiment of the disclosure.

A light-emitting diode 502, a lens 503 and also a CMOS chip 400 described below are provided in a housing 504 of the computer mouse 500. Additional components of the component mouse 500 that are customarily provided in a self-evident manner are not shown nor described in greater detail in this case for reasons of simpler illustration. Examples of such components are a corresponding power supply interface or a data input/output interface, for example a plug connector or a radio interface.

The light-emitting diode 501 emits light having the wavelength $\lambda=630$ nm, the emitted light being directed onto a surface 503 of an object on which the computer mouse 500 is moved, for example onto the surface of a desk. The impinging light is reflected from the surface 503 of the object to the lens 502, concentrated there and directed onto the CMOS chip 400 (described in greater detail below), where the light impinging there is detected and converted into electrical energy by means of the photodiodes integrated there. The signal representing the impinging of the light is evaluated by means of an integrated electrical evaluation circuit known per se, not shown nor described in any greater detail. The relative movement of the computer mouse 500 along the surface 503 of the object is determined in this way.

Figure 4:
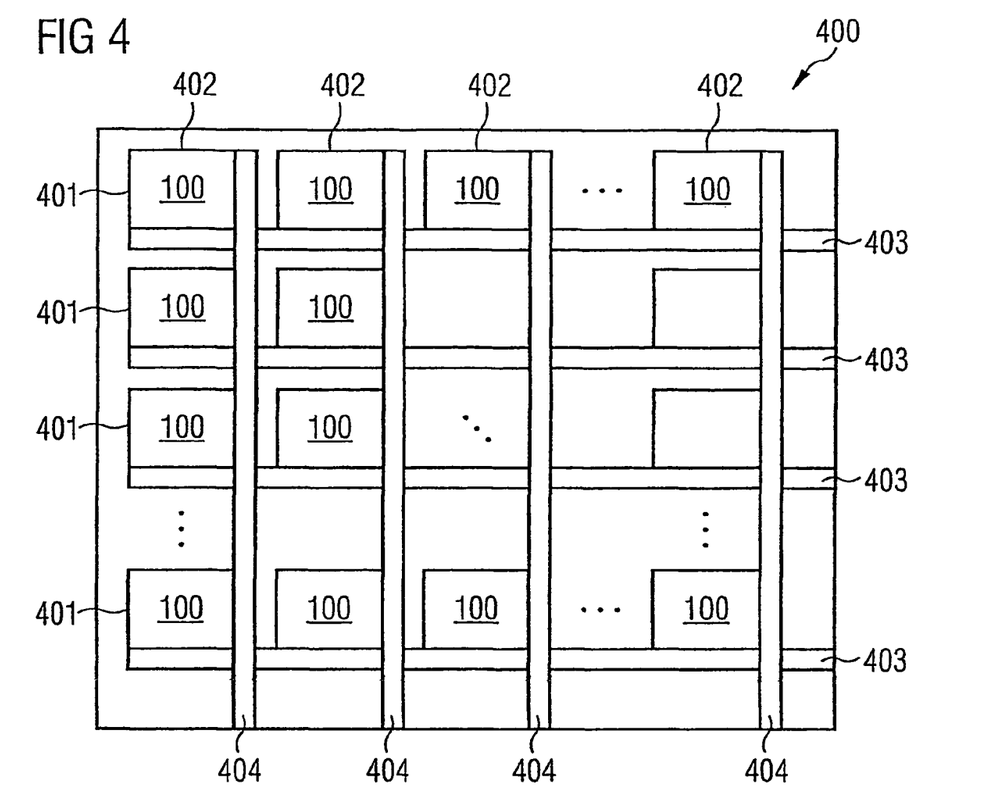
FIG. 4 shows a plan view of one embodiment of an array with a multiplicity of layer stack arrangements arranged in rows and columns in an electronic chip.

FIG. 4 shows the CMOS chip 400 in a plan view in greater detail.

A multiplicity of layer stack arrangements 100 arranged in matrix form in rows 401 and columns 402 are contained on the CMOS chip 400, said layer stack arrangements being explained in greater detail below.

In accordance with this exemplary embodiment of the disclosure, each row and each column respectively contain 40 layer stack arrangements.

Furthermore, each layer stack arrangement 100 of each row 401 is coupled to in each case precisely one row line 403 and each layer stack arrangement 100 of a column 402 is coupled to precisely one column line 404, the row lines being selectable by means of a row decoder and the column lines being selectable by means of a column decoder (not shown).

Via the column lines 404 and the row lines 403, the electric current generated by the photodiodes that are contained in each layer stack arrangement, as will be explained in greater detail below, is detected and forwarded in a manner known per se to an evaluation circuit (not shown) for determining the relative movement of the computer mouse 500 along the surface 503 of the object.

The CMOS chip furthermore has, if appropriate, a radio communication interface, set up for example in accordance with the Bluetooth interface standard, and also additional logic circuits (not shown).

Figure 1:
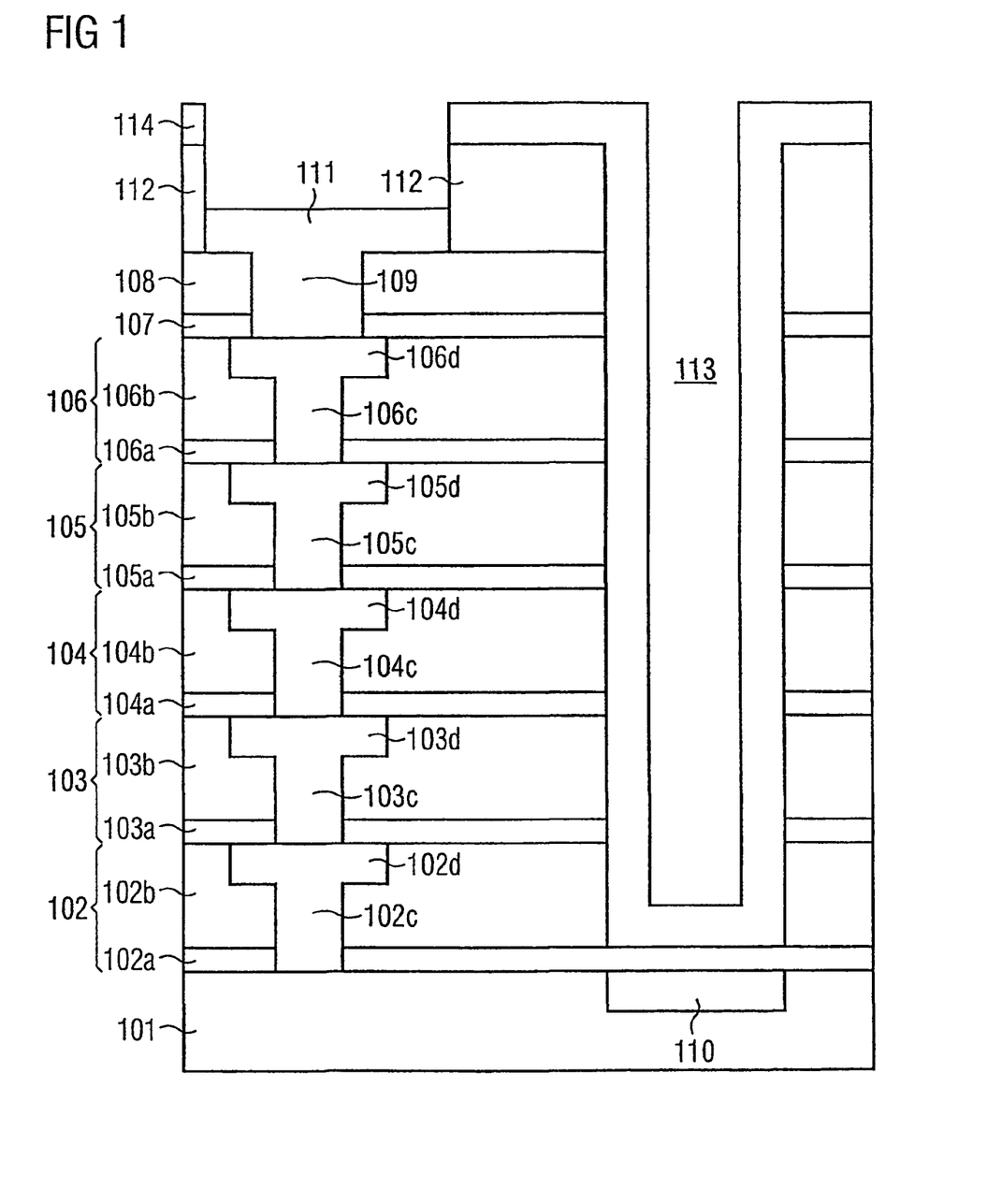
FIG. 1 shows a cross-sectional view of one embodiment of an integrated layer stack arrangement.

FIG. 1 shows the construction of a layer stack arrangement 100 according to the disclosure in cross section.

As is shown in FIG. 1, a first diffusion barrier layer 102a made of silicon nitride is applied on a bulk silicon substrate 101.

In order to apply the individual layers, use is optionally made, in accordance with this exemplary embodiment of the disclosure, of a gas phase deposition method (Chemical Vapor Deposition method, CVD method), alternatively a Physical Vapor Deposition method (PVD method), preferably sputtering.

A first dielectric layer 102b made of a dielectric, for example made of silicon oxide or BPSG (borophosphosilicate glass), is applied on the first diffusion barrier layer 102a. The first diffusion barrier layer 102a and the first dielectric layer 102b form a first partial layer stack together with first contact holes 102c, explained in greater detail below, and a first metallization 102d, i.e. first conductor tracks, which are arranged in accordance with a predetermined circuit layout.

Arranged on the first partial layer stack 102 are a second partial layer stack 103, a third partial layer stack 104, a fourth partial layer stack 105 and also a fifth partial layer stack 106, which are constructed identically in terms of their structure, but the thicknesses of the individual layer stacks may differ according to the disclosure and the course of the conductor tracks in the respective metallization planes, i.e. the metal layers, differs depending on the respectively predetermined layout design.

The conductor tracks of all the metal layers of the partial layer stack arrangement are electrically insulated from one another by means of a dielectric, by means of silicon dioxide in accordance with this exemplary embodiment, alternatively by means of a low-k dielectric (for example SiLK™).

It should be noted in this connection that all the metal layers, in accordance with the exemplary embodiments of the disclosure, are formed in accordance with the damascene technique or in accordance with the dual damascene technique.

The second partial layer stack has a second silicon nitride layer 103a as second diffusion barrier layer, a second silicon dioxide layer as second dielectric layer 103b and also, introduced therein, second contact holes 103c and second metal conductor tracks 103d of the second metallization plane.

The third partial layer stack 104 has a third silicon nitride layer as third diffusion barrier layer 104a, a third silicon dioxide layer as third dielectric layer 104b and also, introduced therein, third contact holes 104c and third metal conductor tracks 104d of the third metallization plane.

The fourth partial layer stack 105 has a fourth silicon nitride layer—applied on the third silicon dioxide layer 104c—as fourth diffusion barrier layer 105a, a fourth silicon dioxide layer—applied thereon—as fourth dielectric layer 105b and also, introduced therein, fourth contact holes 105c and fourth metal conductor tracks 105d of the fourth metallization plane.

Applied on the fourth silicon dioxide layer 106c is the fifth partial layer stack 106, having a fifth silicon nitride layer as fifth diffusion barrier layer 106a, a fifth silicon dioxide layer—applied thereto—as fifth dielectric layer 106b and also, introduced therein, fifth contact holes 106c and fifth metal conductor tracks 106d of the fifth metallization plane.

A photodiode 110 is introduced into the substrate 101.

It should be pointed out in this connection that, according to the disclosure, any desired number of partial layer stacks may be provided and the individual layers within a partial layer stack may also be considerably varied as required.

Above the photodiode 110, a trench 113 is etched into the layer stacks 102, 103, 104, 105, 106 in such a way that the bottom of the trench 113 is formed by the first silicon nitride layer 102a. This is advantageous since, in this way, the substrate and, in particular, the photodiode 110 integrated therein are not damaged in the context of the production method explained in greater detail below.

A sixth diffusion barrier layer 107 made of silicon nitride is deposited on the surface of the fifth silicon dioxide layer 106c. A layer 108 made of silicon dioxide is deposited on the sixth diffusion barrier layer 107. A first passivation partial layer 112 made of silicon nitride having a thickness of 220 nm is applied on the layer 108 made of silicon dioxide, into which connection pads 111 are introduced.

Furthermore, a second passivation partial layer 114 having a thickness of 180 nm is applied on the first passivation partial layer 112, the second passivation partial layer additionally covering the sidewalls of the trench 111 and the bottom of the trench 111.

According to the disclosure, the layer stack arrangement 100 additionally has in the left-hand region illustrated in FIG. 1, i.e. adjacent to the photodiode 110, a multiplicity of transistors that form an electronic circuit, the electronic circuit being configured as an amplifier circuit and/or as an analog/digital converter circuit (not shown in FIG. 1).

The individual method steps for producing the layer stack arrangement 100 are explained in more detail in FIG. 3a to FIG. 3g.

Figure 3A:
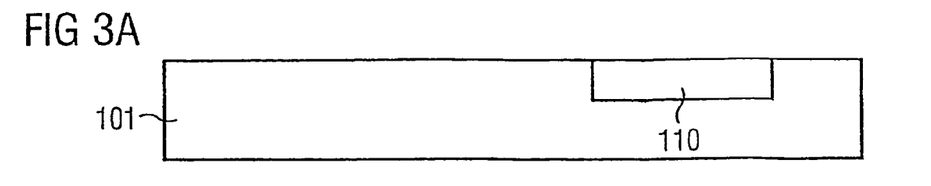
FIGS. 3a to 3g show cross-sectional views of one embodiment of the layer stack arrangement during the method for producing the layer stack arrangement at different points in time.

Proceeding from a bulk silicon, a photodiode is formed in the latter by doping a predetermined region in the silicon substrate 101 with doping atoms, with boron atoms in accordance with this exemplary embodiment, alternatively with phosphorus atoms (cf. FIG. 3a).

Figure 3B:
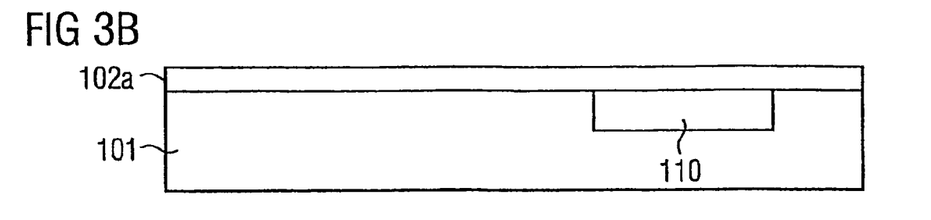

A diffusion barrier layer 102a made of silicon nitride having a thickness of 50 nm is applied to the substrate 101 and the photodiode 110 by means of a CVD method or by means of a PVD method (cf. FIG. 3b).

Figure 3C:
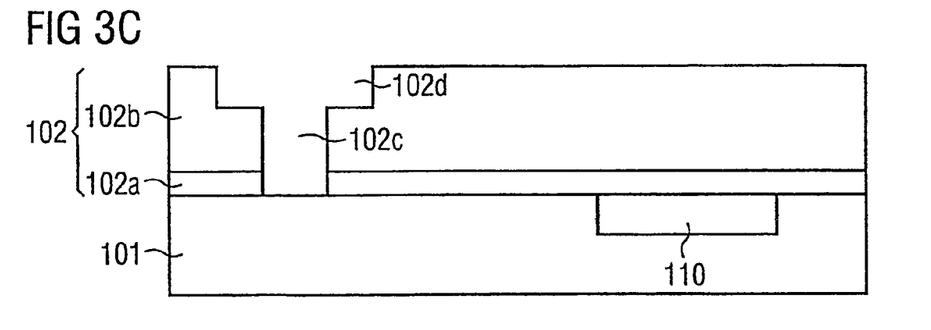

As is illustrated in FIG. 3c, in a subsequent step, a first dielectric layer 102b made of a dielectric, for example made of silicon oxide or BPSG (borophosphosilicate glass), is applied to the first diffusion barrier layer 102a. Afterward, in a manner known per se, first contact holes 102c are defined by means of a lithography method and subsequently etched and filled with tungsten and the structures for the first metallization plane are subsequently formed using a suitable lithography method. Preferably, the first metallization plane is formed from a metallic diffusion barrier layer (not shown) made of tantalum nitride (TaN) and copper conductor tracks 102d, to put it another way from a metal layer 102d, made from copper in accordance with this exemplary embodiment. The excess metal is removed by means of a chemical mechanical polishing method (CMP method).

The first diffusion barrier layer 102a, the first dielectric layer 102b, the first contact holes 102c and the first metal conductor tracks 102d together form a first partial layer stack 102.

This process is also referred to as a damascene process. As an alternative, the so-called dual damascene process may be used for forming the metallization planes.

All the metallization planes of the partial layer stacks described below are formed in a corresponding manner.

Figure 3D:
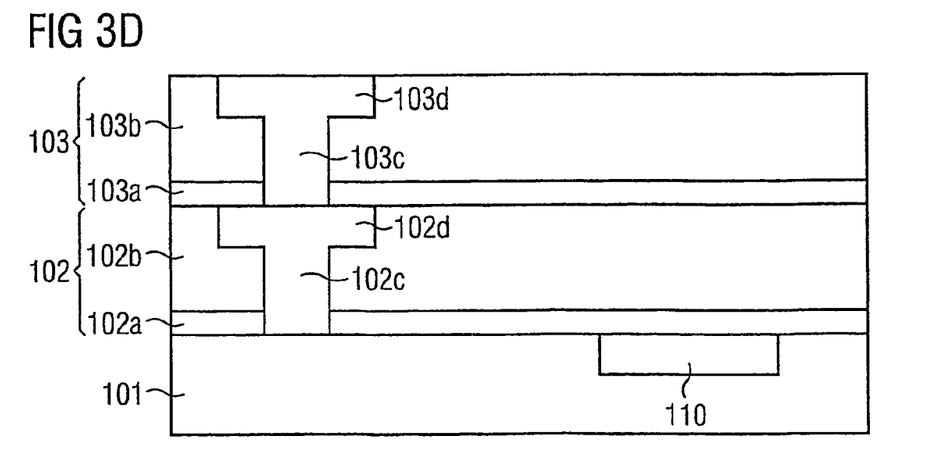

Consequently, a second partial layer stack 103 is formed on the first dielectric layer 102b and the first metal conductor tracks 102d (cf. FIG. 3d). This is done by depositing a second diffusion barrier layer 103a on the first dielectric layer 102b and the first metal conductor tracks 102d and subsequently depositing a second dielectric layer 103b made of silicon dioxide on the second diffusion barrier layer 103a. The regions for second metal conductor tracks 103d are then defined by means of a suitable lithography method and etched. Afterward, second contact holes 103c are defined by means of a lithography method and etched down to the upper surface of the silicon substrate 101. Afterward, a diffusion barrier layer (not shown) made of tantalum nitride (TaN) is again formed and the second contact holes 103c and the regions for the second metallization plane are filled with copper and the excess copper is again removed by means of a CMP method, thereby forming second copper conductor tracks 103d.

The second partial layer stack 103 is thus completed.

Figure 3E:
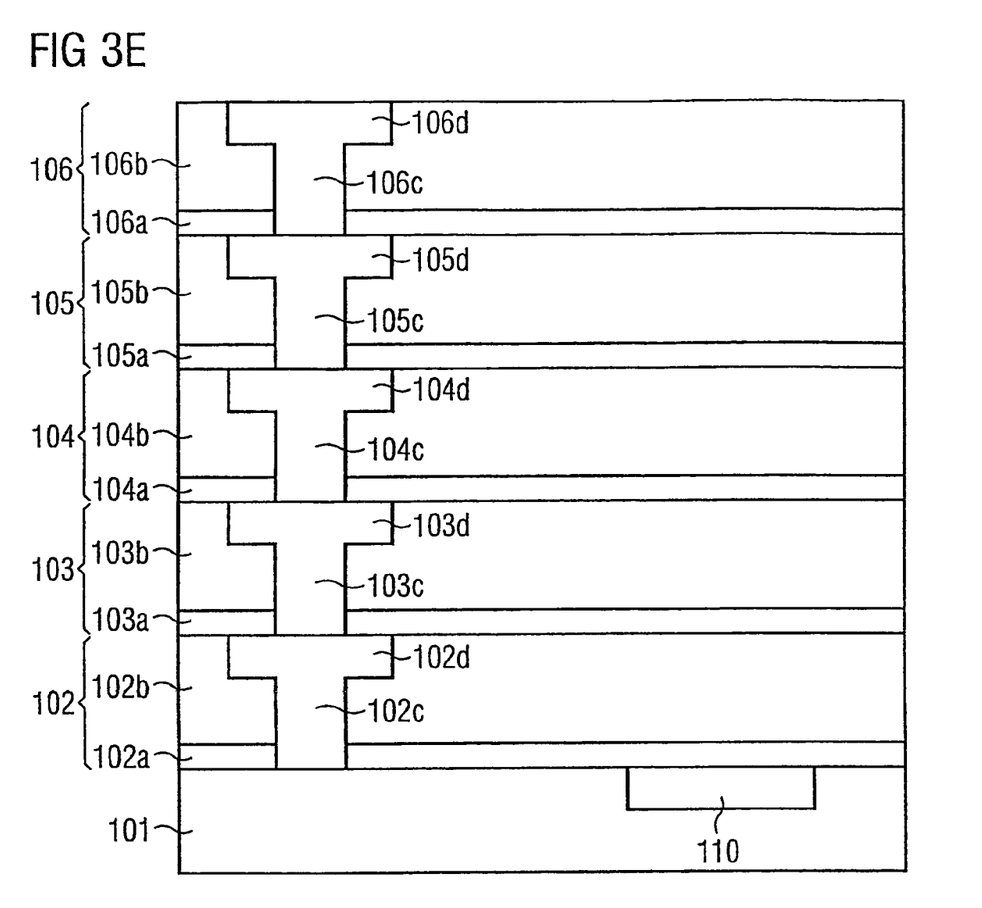

This procedure is repeated until the desired number of partial layer stacks 102, 103, 104, 105, 106, five partial layer stacks 102, 103, 104, 105, 106 in accordance with this exemplary embodiment, have been formed (cf. FIG. 3e).

Each partial layer stack 102, 103, 104, 105, 106 thus has a diffusion barrier layer 102a, 103a, 104a, 105a, 106a, preferably made of silicon nitride, a dielectric layer 102b, 103b, 104b, 105b, 106b, preferably made of silicon dioxide or BPSG, a metallic diffusion barrier layer (not shown), preferably made of tantalum nitride, contact holes 102c, 103c, 104c, 105c, 106c, and metal conductor tracks 102d, 103d, 104d, 105d, 106d of the respective metallization plane.

Figure 3F:
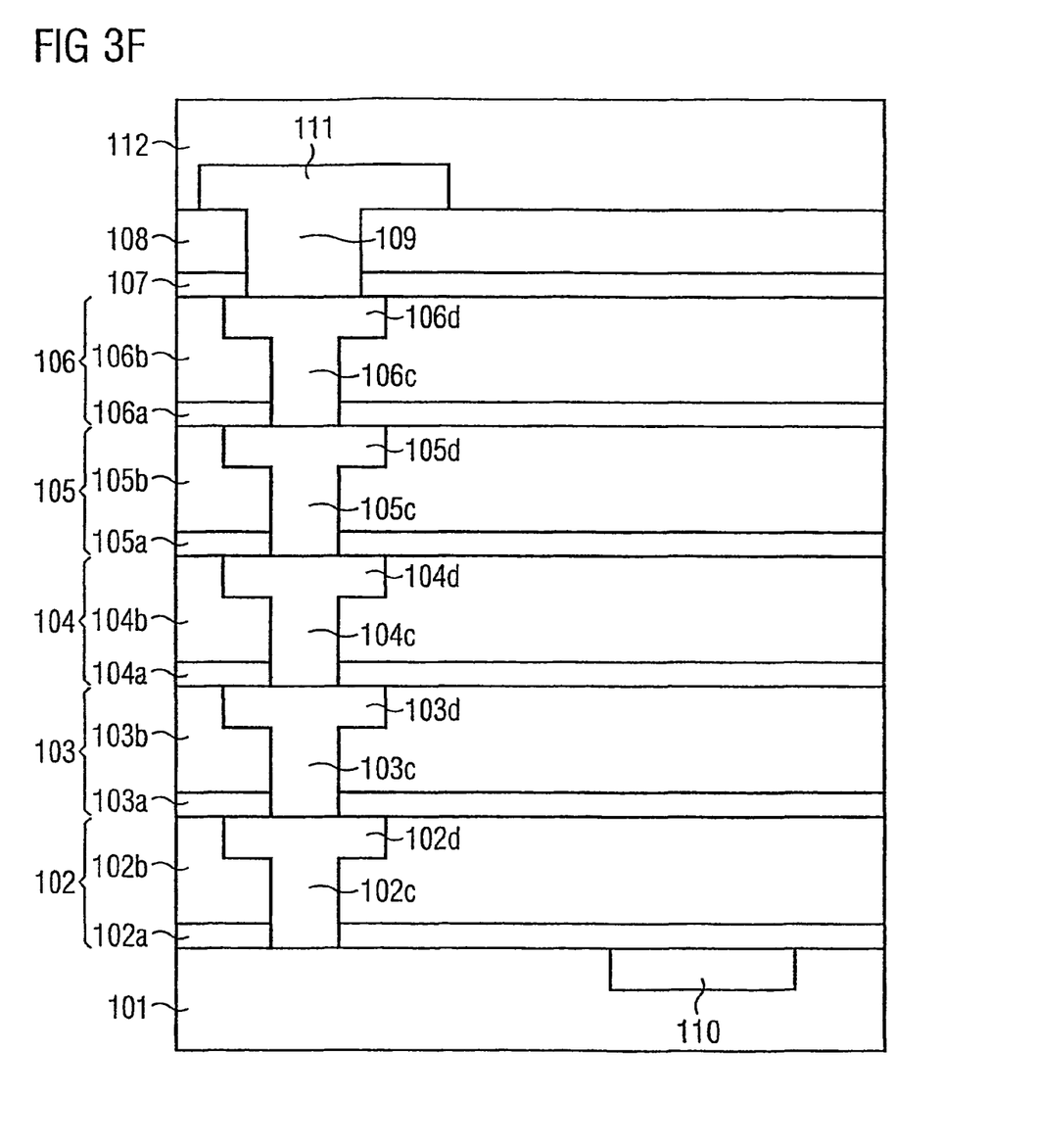

A sixth diffusion barrier layer 107 made of silicon nitride, preferably having a thickness of 100 nm, is deposited onto the fifth dielectric layer 106b and the fifth metal conductor tracks 106d (cf. FIG. 3f). A layer 108 made of silicon dioxide is deposited onto the sixth diffusion barrier layer 107. Using a lithography method, contact holes 109 are defined and etched as far as the upper surface of the fifth metal conductor tracks 106d. A metallic diffusion barrier layer (not shown) made of tantalum nitride is subsequently sputtered onto the surface of the contact holes 109. Afterward, an aluminum layer is sputtered on and patterned using a further lithography method, thereby forming connection pads 111.

As an alternative, the connection pads are produced from copper by means of a process correspondingly adapted thereto.

A silicon nitride layer 112 is applied as the first passivation partial layer 112 having a thickness of 220 nm to the upper surface of the layer 108 made of silicon dioxide and the connection pads 111.

Figure 3G:
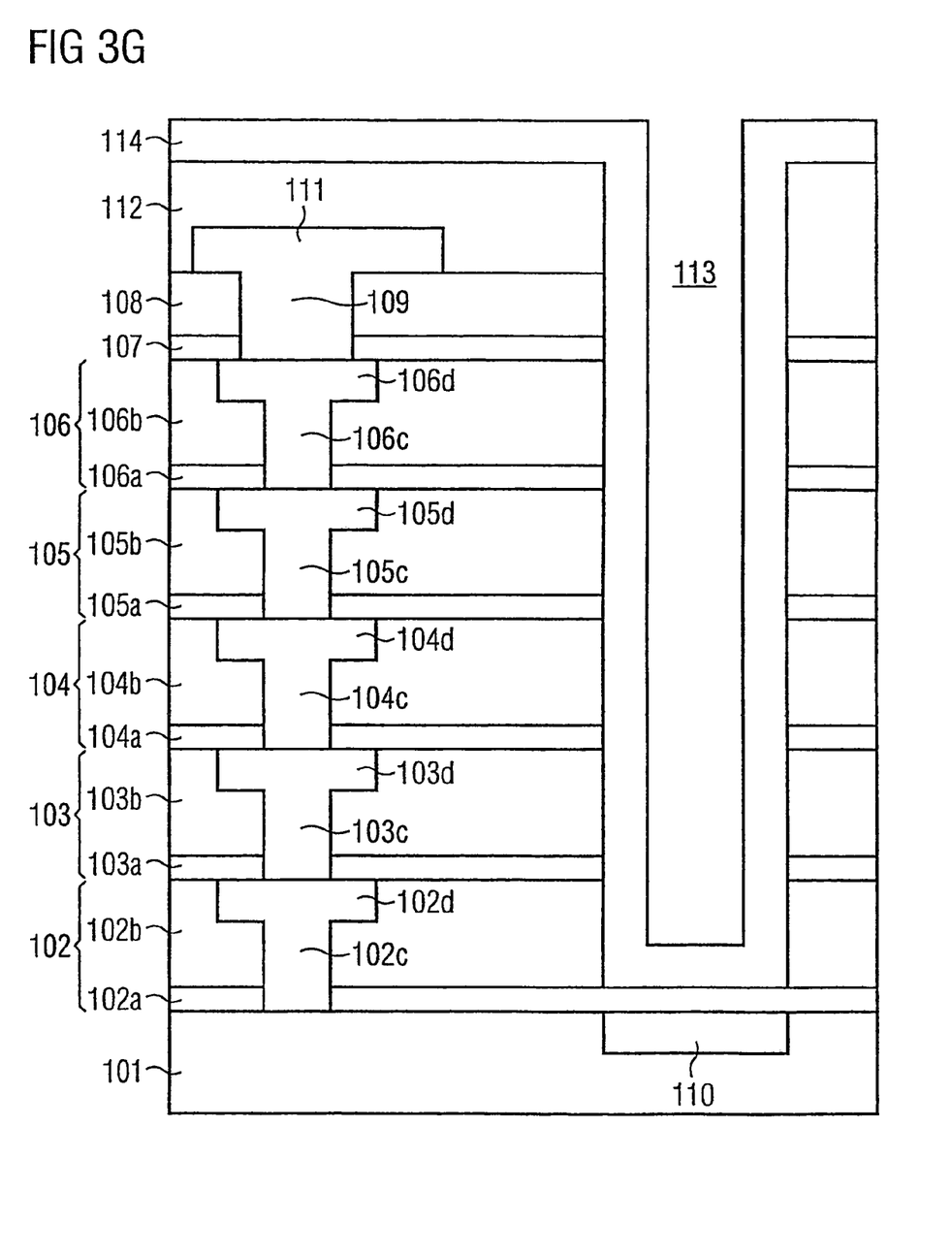

In a subsequent step, using an additional photomask, a region above the photodiode 110 is etched free, i.e. the layer stacks 102, 103, 104, 105, 106 are removed in the region above the photodiode 110 by means of an anisotropic dry etching method, thereby forming the trench 113 (cf. FIG. 3g). An etching stop of the dry etching method is effected on the first silicon nitride layer 102a.

In a subsequent step, the second passivation partial layer 114 made of silicon nitride having a thickness of 180 nm is deposited conformly above the first passivation layer 112, and all walls of the trench 113, i.e. the sidewalls and the bottom of the trench 113.

Finally, using a further photomask and a lithography method, the connection pads 112 are uncovered, the region of the trench, i.e. the region above the photodiode 110, remaining unchanged (cf. FIG. 1).

Figure 7:
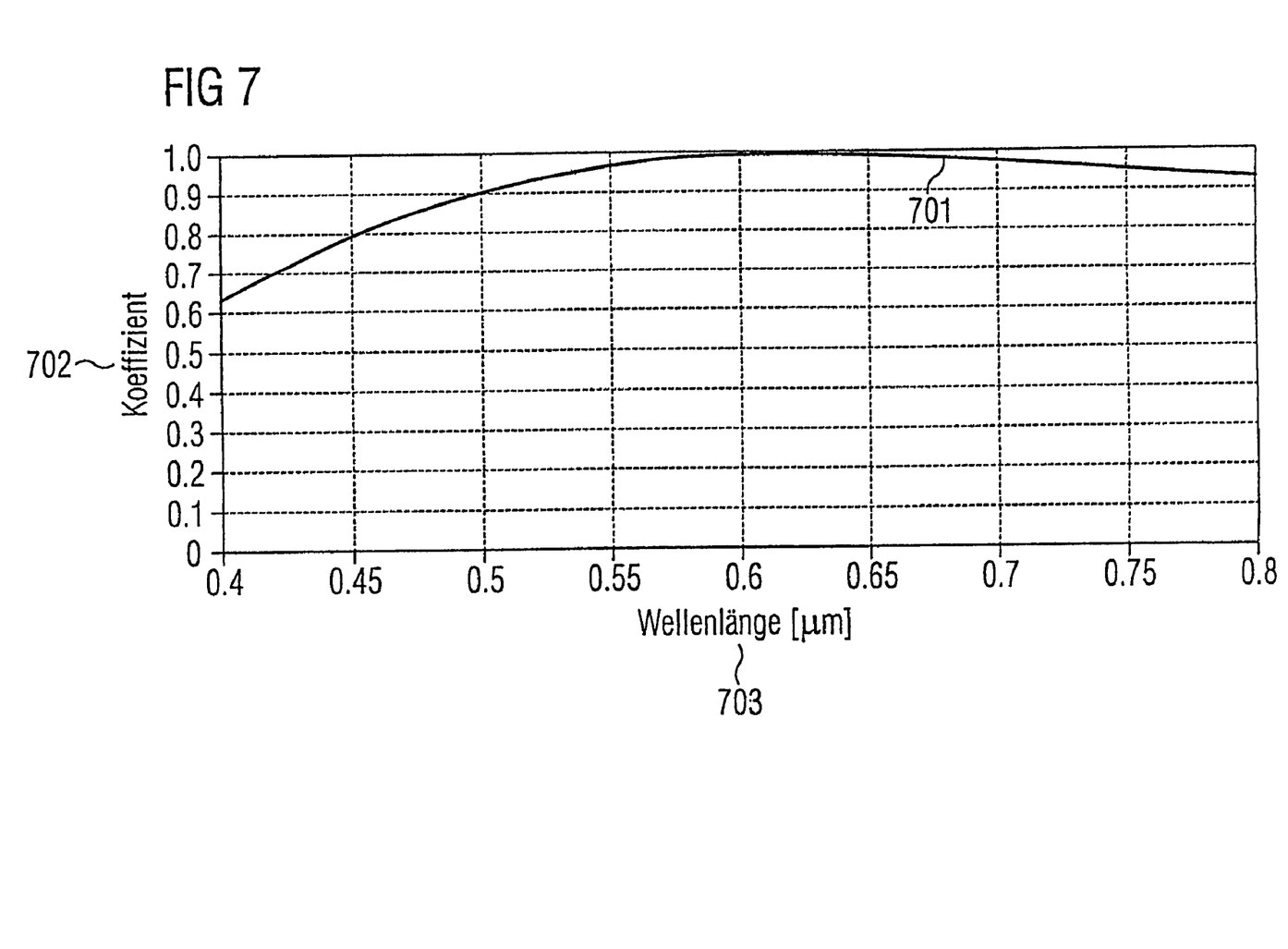
FIG. 7 shows a transmission curve of an integrated layer stack arrangement in accordance with an exemplary embodiment of the disclosure.

FIG. 7 shows a transmission curve 701 for the layer stack arrangement 100 according to the disclosure, the illustration again showing the transmission coefficients 702 depending on the respective wavelength 703 of the light radiated in.

The layer thicknesses of the individual layers of the layer stack arrangement in accordance with this exemplary embodiment of the disclosure are as follows:

first diffusion barrier layer 102a: 5 nm;
first dielectric layer 102b: 750 nm;
second diffusion barrier layer 103a: 50 nm;
second dielectric layer 103b: 620 nm;
third diffusion barrier layer 104a: 50 nm;
third silicon dioxide layer 104b: 720 nm;
fourth diffusion barrier layer 105a: 70 nm;
fourth silicon dioxide layer 105b: 1080 nm;
fifth diffusion barrier layer 106a: 100 nm;
fifth silicon dioxide layer 106b: 1300 nm;
sixth diffusion barrier layer: 100 nm;
layer 108: 1350 nm;
first passivation partial layer 112: 220 nm;
second passivation partial layer 113: 180 nm.

Consequently, a total thickness of 400 nm, as is provided for a customary passivation layer, results for the totality of the two passivation partial layers 112 and 114.

The region of the layer stack arrangement in which the logic circuits are provided is thus sufficiently protected.

Thus, according to the disclosure, it is only necessary to requalify the far back end of line process with regard to the new process according to the disclosure.

Figure 6:
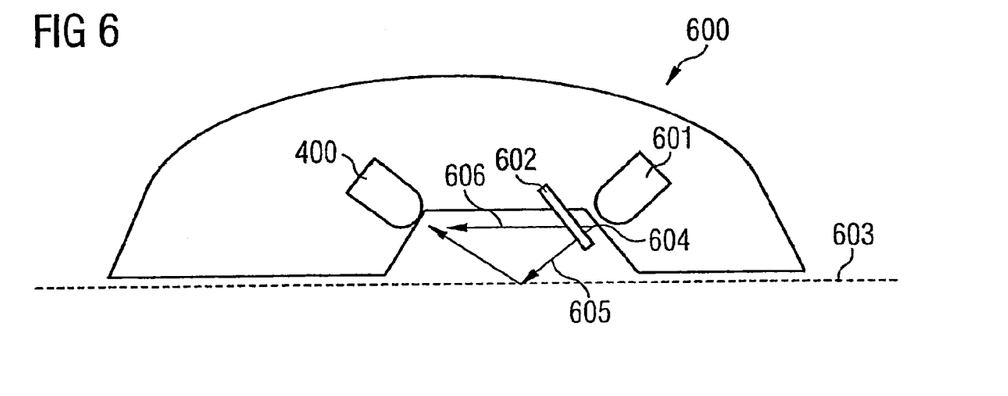
FIG. 6 shows a sketch of another embodiment of a computer mouse.

FIG. 6 shows a computer mouse 600 in accordance with a second exemplary embodiment of the disclosure.

In addition to a laser element 601, the computer mouse 600 has, in a housing 607, the CMOS chip 400 and also a beam splitter 602, which splits a light beam 604 directed from the laser element 601 onto a surface 603 of an object into a first partial light beam 605, which remains directed onto the surface 603 of the object, and into a second partial light beam 606, which is directed directly in the direction of the CMOS chip 400. The first partial light beam 605 is reflected from the surface 603 and likewise conducted partly to the CMOS chip 400.

Light is brought to interference by means of an evaluation circuit that is coupled to the CMOS chip 400 or integrated therein. In the event of the light undergoing a frequency shift such as is effected by movement of the sensor relative to the surface 603—this is also referred to as the Doppler effect—the speed of the computer mouse 600 can be calculated from the interference signal.

The disclosure can clearly be seen in the fact that the metal stack of a layer stack arrangement according to the disclosure is removed in a targeted manner and an optically adapted silicon nitride layer is deposited, thereby ensuring a maximum transmission of the light impinging on the CMOS chip 400 toward the photodiode.

The disclosure is particularly suitable for an optical computer mouse, generally for any application in which the aspect ratio of the trench 111 to be formed is relatively large.

As can be seen from FIG. 7, according to the disclosure it is now possible very simply and reliably to choose the thickness of the individual layers in the layer stack arrangement in such a way as to optimize the transmission of the incident light by the layer stack arrangement.

The invention claimed is:

1. An integrated layer stack arrangement comprising:
    a plurality of layer stacks arranged one above the other, each layer of the plurality of layer stacks comprising a metal layer and a dielectric layer;
    at least one integrated photodiode integrated into the plurality of layer stacks;
    a trench arranged above the photodiode comprising a bottom and a set of walls, the trench extending through at least a portion of the plurality of layer stacks, so that light impinging on the plurality of layer stacks impinges on the integrated photodiode along the trench;
    a first passivation partial layer applied on the plurality of layer stacks; and
    a second passivation partial layer applied on the first passivation partial layer, the bottom of the trench and the set of walls of the trench;
    wherein only the second passivation partial layer covers the bottom of the trench and the set of walls of the trench.

2. The integrated layer stack arrangement of claim 1, wherein at least one layer of the plurality of layer stacks comprise a diffusion layer between the metal layer and the dielectric layer of the at least one layer.

3. The integrated layer stack arrangement of claim 2, wherein the diffusion layer comprises silicon nitride.

4. The integrated layer stack arrangement of claim 2, wherein the diffusion layer comprises silicon carbide.

5. The integrated layer stack arrangement of claim 1, wherein the metal layer of each layer of the plurality of layer stacks comprises copper.

6. The integrated layer stack arrangement of claim 1, wherein the dielectric layer of each layer of the plurality of layer stacks comprises silicon dioxide.

7. The integrated layer stack of claim 1, wherein the first and second passivation layers comprise silicon nitride.

8. The integrated layer stack of claim 1, further comprising:
    an electrical circuit electrically coupled to the at least one integrated photodiode the electrical circuit operative to process an electrical signal generated by the at least one integrated photodiode.

9. The integrated layer stack of claim 8, wherein the electrical circuit comprises an amplifier circuit.

10. The integrated layer stack of claim 8, wherein the electrical circuit comprises an analog/digital converter circuit.

11. An optical sensor comprising:
    a housing comprising a light-transmissive cover; and
    at least one integrated layer stack arrangement located within the housing, each of the at least one integrated layer stack comprising:
        a plurality of layer stacks arranged one above the other, each layer of the plurality of layer stacks comprising a metal layer and a dielectric layer;
        at least one integrated photodiode integrated into the plurality of layer stacks;
        a trench arranged above the photodiode comprising a bottom and a set of walls, the trench extending through at least a portion of the plurality of layer stacks, so that light impinging on the plurality of layer stacks impinges on the integrated photodiode along the trench;

a first passivation partial layer applied on the plurality of layer stacks; and a second passivation partial layer applied on the first passivation partial layer, the bottom of the trench and the set of walls of the trench;

wherein the light-transmissive cover is located above the trench of the at least one integrated layer stack so that light impinging on the housing can pass through the light-transmissive cover to the trench; and wherein only the second passivation partial layer covers the bottom of the trench and the set of walls of the trench.

12. The optical sensor of claim 11, wherein the housing is a ceramic housing and the light-transmissive cover is a glass cover.

13. The optical sensor of claim 11, wherein the at least one integrated layer stack arrangement is introduced into an optical potting composition.

14. The optical sensor of claim 13, wherein the optical potting composition comprises epoxy resin.

15. An optical sensor comprising:

a housing defining an opening; and at least one integrated layer stack arrangement located within the housing, each of the at least one integrated layer stack comprising:

a plurality of layer stacks arranged one above the other, each layer of the plurality of layer stacks comprising a metal layer and a dielectric layer;

at least one integrated photodiode integrated into the plurality of layer stacks;

a trench arranged above the photodiode comprising a bottom and a set of walls, the trench extending through at least a portion of the plurality of layer stacks, so that light impinging on the plurality of layer stacks impinges on the integrated photodiode along the trench;

a first passivation partial layer applied on the plurality of layer stacks; and a second passivation partial layer applied on the first passivation partial layer, the bottom of the trench and the set of walls of the trench;

wherein the opening is located above the trench of the at least one integrated layer stack so that light impinging on the housing can pass through the opening in the housing to the trench; and wherein only the second passivation partial layer covers the bottom of the trench and the set of walls of the trench.

16. The optical sensor of claim 15, further comprising:

an optical lens covering at least a portion of the trench of one of the at least one integrated layer stack arrangement.

* * * * *